(12) United States Patent
Liu et al.

(10) Patent No.: US 9,379,332 B2
(45) Date of Patent: Jun. 28, 2016

(54) ELECTRO-LUMINESCENCE DISPLAY PANEL AND FABRICATION METHOD THEREOF, DISPLAY DEVICE

(71) Applicants: BOE Technology Group Co., Ltd., Beijing (CN); Beijing BOE Optoelectronics Technology Co., Ltd., Beijing (CN)

(72) Inventors: Peng Liu, Beijing (CN); Xue Dong, Beijing (CN); Renwei Guo, Beijing (CN)

(73) Assignees: BOE Technology Group Co., Ltd., Beijing (CN); Beijing BOE Optoelectronics Technology Co., Ltd., Beijing (CN)

(*) Notice: Subject to any disclaimer, the term of this patent is extended or adjusted under 35 U.S.C. 154(b) by 0 days.

(21) Appl. No.: 14/516,703

(22) Filed: Oct. 17, 2014

(65) Prior Publication Data

US 2015/0380653 A1     Dec. 31, 2015

(30) Foreign Application Priority Data

Jun. 25, 2014   (CN) .......................... 2014 1 0292919

(51) Int. Cl.
*H01L 33/08*   (2010.01)
*H01L 51/00*   (2006.01)
*H01L 51/56*   (2006.01)
*H01L 33/06*   (2010.01)
*H01L 33/00*   (2010.01)
*H01L 51/50*   (2006.01)

(52) U.S. Cl.
CPC .......... *H01L 51/0036* (2013.01); *H01L 33/005* (2013.01); *H01L 33/06* (2013.01); *H01L 33/08* (2013.01); *H01L 51/56* (2013.01); *H01L 51/5056* (2013.01); *H01L 51/5096* (2013.01)

(58) Field of Classification Search
CPC ..... H01L 51/0036; H01L 33/08; H01L 51/56; H01L 33/06; H01L 33/005; H01L 51/5056; H01L 51/5096
See application file for complete search history.

(56) References Cited

U.S. PATENT DOCUMENTS 8,552,416 B2 * 10/2013 Kim .................. H01L 51/502
                                                        257/13
2014/0145145 A1 * 5/2014 Lee .................. H01L 51/5012
                                                        257/13

* cited by examiner

*Primary Examiner* — Roy Potter
*Assistant Examiner* — Paul Patton
(74) *Attorney, Agent, or Firm* — Banner & Witcoff, Ltd.

(57) ABSTRACT

Embodiments of the disclosure provide an electro-luminescence display panel and a fabrication method thereof, and a display device. The electro-luminescence display panel comprises a plurality of light-emitting units. Each light-emitting unit comprises a plurality of sub light-emitting units for displaying different colors, an electro-luminescence structure is provided in each of the sub light-emitting units, and the electro-luminescence structure comprises a quantum dot light-emitting layer.

15 Claims, 8 Drawing Sheets

ELECTRO-LUMINESCENCE DISPLAY PANEL AND FABRICATION METHOD THEREOF, DISPLAY DEVICE

This application claims priority to Chinese Patent Application No. 201410292919.2, filed on Jun. 25, 2014. The present application claims priority to and the benefit of the above-identified application and is incorporated herein in its entirety.

TECHNICAL FIELD

Embodiments of the disclosure relate to an electro-luminescence display panel and a fabrication method thereof, and a display device.

BACKGROUND

Generally, three primary colors of red, green and blue of a color display screen are realized by employing a white light to pass through color filter films, but in this case, the transmittance is low and consequently the brightness is reduced. OLED (Organic Light Emitting Diode) using the electro-fluorescence phenomenon can replace the color filter film, so that the transmittance is increased and the power consumption is correspondingly reduced.

At present, the quantum dot electro-luminescence display panel is low in luminescence efficiency, for the quantum dot for emitting light is coated with long organic chains, which block the movement of the holes and electrons and are not good for the recombination of the holes and electrons.

SUMMARY

According to the embodiments of this disclosure, an electro-luminescence display panel is provided. The electro-luminescence display panel comprises a plurality of light-emitting units. Each light-emitting unit comprises a plurality of sub light-emitting units for displaying different colors, an electro-luminescence structure is provided in each of the sub light-emitting units, and the electro-luminescence structure comprises a quantum dot light-emitting layer.

For example, in the light-emitting unit, at least one quantum dot light-emitting layer is a composite quantum dot light-emitting layer.

For example, in the light-emitting unit, the quantum dot light-emitting layer is a monochromic quantum dot light-emitting layer.

For example, the composite quantum dot light-emitting layer is provided between the monochromic quantum dot light-emitting layers.

For example, the monochromic quantum dot light-emitting layer is a red quantum dot light-emitting layer, a green quantum dot light-emitting layer or a blue quantum dot light-emitting layer.

For example, the composite quantum dot light-emitting layer is a white quantum dot light-emitting layer.

For example, the composite quantum dot light-emitting layer is formed by mixing a red quantum dot light-emitting layer, a green quantum dot light-emitting layer and a blue quantum dot light-emitting layer.

For example, the electro-luminescence structure sequentially comprises an anode, a hole transport layer, the quantum dot light-emitting layer and a cathode, and the hole transport layer is made of a material comprising poly (3,4-ethylenedioxy thiophene)-poly (styrene sulfonic acid).

For example, the electro-luminescence structure further comprises a hole barrier layer provided between the quantum dot light-emitting layer and the cathode, and the hole barrier layer is made of a material comprising 1,3,5-tri (1-phenyl-1H-benzimidazole-2-yl) benzene.

According to the embodiments of this disclosure, a fabrication method of an electro-luminescence display panel is provided. The method comprises: forming a plurality of light-emitting units. Each light-emitting unit comprises a plurality of sub light-emitting units for displaying different colors. The method further comprises forming an electro-luminescence structure in each of the sub light-emitting units, and the electro-luminescence structure comprises a quantum dot light-emitting layer.

For example, in the light-emitting unit, at least one quantum dot light-emitting layer is a composite quantum dot light-emitting layer.

For example, in the light-emitting unit, the quantum dot light-emitting layer is a monochromic quantum dot light-emitting layer.

For example, the composite quantum dot light-emitting layer is provided between the monochromic quantum dot light-emitting layers.

For example, the forming the electro-luminescence structure comprises: forming an anode on a substrate; forming a hole transport layer on the anode; forming the quantum dot light-emitting layer on the hole transport layer; and forming a cathode on the quantum dot light-emitting layer.

For example, the forming the hole transport layer on the anode is: dispersing poly (3,4-ethylenedioxy thiophene)-poly (styrene sulfonic acid) in isopropyl alcohol, and forming the hole transport layer on the anode, and the volume ratio of the isopropyl alcohol and the poly (3,4-ethylenedioxy thiophene)-poly (styrene sulfonic acid) is 1:1-3:1.

For example, the forming the quantum dot light-emitting layer on the hole transport layer comprises: forming the quantum dot light-emitting layer on the hole transport layer; dissolving 3-mercaptopropionic acid into the acetonitrile solution to clean the quantum dot light-emitting layer, wherein the volume ratio of 3-mercaptopropionic acid and acetonitrile is 1:8-1:12; and cleaning the quantum dot light-emitting layer by pure acetonitrile.

For example, the forming the electro-luminescence structure further comprises: forming a hole barrier layer between the quantum dot light-emitting layer and the cathode, and the hole barrier layer is made of a material comprising 1,3,5-tri (1-phenyl-1H-benzimidazole-2-yl) benzene (TPBI).

According to the embodiments of this disclosure, a display device is provided. The display device comprises the electro-luminescence display panel as described above.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DESCRIPTION OF THE EMBODIMENTS

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Embodiments of the disclosure adopt the quantum dot electro-luminescence phenomenon; on the one hand, the conventional color filter film is removed; on the other hand, brightness and efficiency of display panel are greatly improved by designing the quantum dot light-emitting layer.

Figure 1:
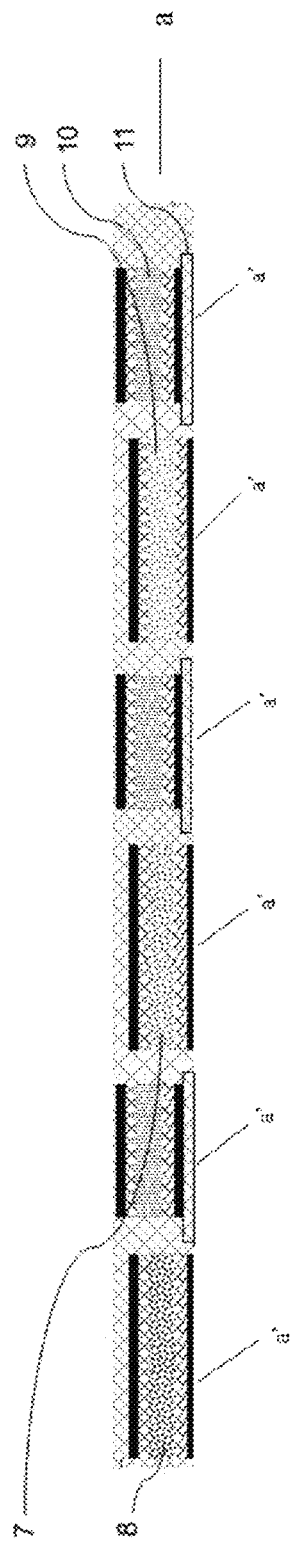
FIG. 1 is a structural view of a light-emitting unit of an electro-luminescence display panel according to embodiments of this disclosure.

According to the embodiments of this disclosure, an electro-luminescence display panel is provided. As shown in FIG. 1, the electro-luminescence display panel comprises a plurality of light-emitting units 100, each light-emitting unit 100 comprises a plurality of sub light-emitting units 100' for displaying different colors, an electro-luminescence structure is provided in each of the sub light-emitting units, and the electro-luminescence structure comprises a quantum dot light-emitting layer.

In the light-emitting unit, the quantum dot light-emitting layer is a monochromic quantum dot light-emitting layer, such as a blue quantum dot light-emitting layer 7, a red quantum dot light-emitting layer 8 or a green quantum dot light-emitting layer 9.

Furthermore, in the light-emitting unit, at least one quantum dot light-emitting layer is a composite quantum dot light-emitting layer. For example, the composite quantum dot light-emitting layer is a white quantum dot light-emitting layer 10. For example, the composite quantum dot light-emitting layer is formed by mixing the red quantum dot light-emitting layer, the green quantum dot light-emitting layer and the blue quantum dot light-emitting layer. For example, the composite quantum dot light-emitting layer is provided between monochromic quantum dot light-emitting layers of different colors.

In FIG. 1, the light-emitting unit 100 of the electro-luminescence display panel comprises the blue quantum dot light-emitting layer 7, the red quantum dot light-emitting layer 8, the green quantum dot light-emitting layer 9 and three composite quantum dot light-emitting layers; moreover, the three composite quantum dot light-emitting layers are respectively provided between the red quantum dot light-emitting layer 8 and the blue quantum dot light-emitting layer 7, between the blue quantum dot light-emitting layer 7 and the green quantum dot light-emitting layer 9, and between the green quantum dot light-emitting layer 9 and the red quantum dot light-emitting layer 8. However, the embodiments of the disclosure are not limited thereto, the light-emitting unit 100 may comprise the monochromic quantum dot light-emitting layers of other colors and other quantities and the composite quantum dot light-emitting layers of other quantities, and these monochromic quantum dot light-emitting layers and these composite quantum dot light-emitting layers may be arranged in any desired order.

According to the embodiments of this disclosure, the light-emitting layer is the quantum dot light-emitting layer, which replaces the traditional color filter film and backlight due to its self-luminous property, so that the display panel becomes thinner. Besides, the half-peak widths of three primary colors of R, G and B obtained by the quantum dot electroluminescence are narrow, monochromaticities are good, and both of color gamut and color reducibility of the display panel are improved. Meanwhile, at least one quantum dot light-emitting layer in the light-emitting unit is the composite quantum dot light-emitting layer, and in this case, brightness of the display panel is greatly improved.

Figure 2:
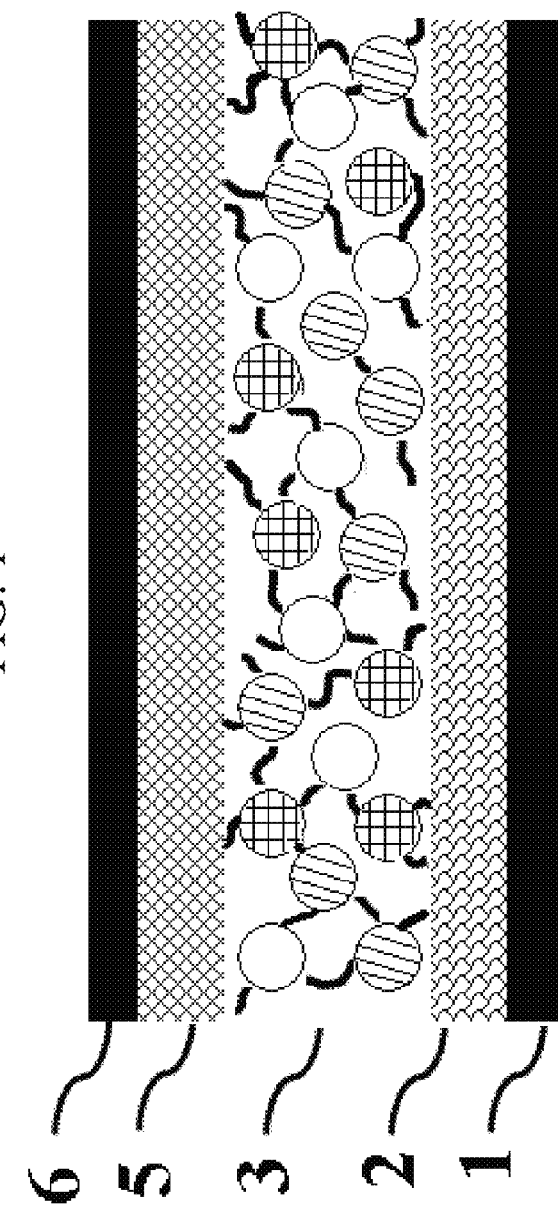
FIG. 2 is a structural view of an electro-luminescence light-emitting structure.
Figure 3:
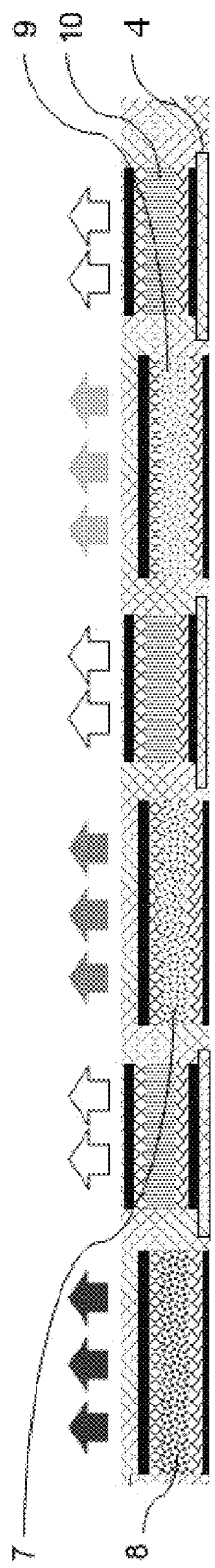
FIG. 3 is a view of the arrangement of different quantum dot light-emitting layers of the electro-luminescence display panel according to the embodiments of this disclosure.

As shown in FIG. 2, the electro-luminescence structure sequentially comprises an anode 1, a hole transport layer 2, a quantum dot light-emitting layer 3 and a cathode 6 from bottom to top.

For example, the quantum dot light-emitting layer shown in FIG. 2 is a composite quantum dot light-emitting layer.

For example, the hole transport layer 2 is made of a material comprising poly (3,4-ethylenedioxy thiophene)-poly (styrene sulfonic acid).

For example, the electro-luminescence structure further comprises a hole barrier layer, and the hole barrier layer is provided between the quantum dot light-emitting layer 3 and the cathode 6. For example, the hole barrier layer is made of a material comprising 1,3,5-tri (1-phenyl-1H-benzimidazole-2-yl) benzene (TPBI).

In order to avoid color aberration along with the change of voltage, the embodiments of the disclosure employs TPBI to form the hole barrier layer, wherein the TPBI is 1,3,5-tri (1-phenyl-1H-benzimidazole-2-yl) benzene. TPBI has a LOMO energy level higher than a conventional material BCP, so its hole barrier performance is more effective than BCP, and in this case, the stability of the display panel is improved. Under the condition of same brightness (169 cd/m$^2$), luminous efficiency of OLED using BCP as the hole barrier layer is about 231 m/w, and luminous efficiency of OLED using TPBI as the hole barrier layer is about 321 m/w. While the luminous efficiency is greatly increased, the required working voltage is reduced, the power consumption is lowered, so that the light-emitting region is restricted to the quantum dot light-emitting layer. Thereby, the carrier recombination efficiency is improved, the color aberration caused by shift of the light-emitting region is avoided, and the color coordinates are more stable.

For example, the cathode is formed of a LiF/Al layer. The LiF layer is used as a protective layer in order to prevent the quantum dot light-emitting layer from being damaged by external environment and make the light-emitting structure more stable.

For example, the light-emitting unit further comprises a black matrix 4 and a TFT (not shown), the black matrix 4 is provided below the anode of the composite quantum dot light-emitting layer, and the TFT is further arranged below the black matrix. Thus, in the embodiments of the disclosure, the TFT is arranged below the composite quantum dot light-emitting layer and sealed by the black matrix; the monochromic quantum dot light-emitting layers are separated by the black matrix, thereby avoiding declined contrast ratio which may be caused by introducing the composite quantum dot light-emitting layer.

In the display panel according to the embodiments of the disclosure, the holes injected from the anode reach the quantum dot light-emitting layer; as the TPBI is a strong barrier for the holes, the holes are restricted to the quantum dot light-emitting layer and recombine with the electrons injected from the cathode (Al electrode) to emit light.

According to the embodiments of the disclosure, a fabrication method of an electro-luminescence display panel is provided. For example, the method comprises: forming a plurality of light-emitting units. Each light-emitting unit comprises a plurality of sub light-emitting units for displaying different colors. The method further comprises: forming an electro-luminescence structure in each of the sub light-emitting units. The electro-luminescence structure comprises a quantum dot light-emitting layer.

In the light-emitting unit, the quantum dot light-emitting layer is a monochromic quantum dot light-emitting layer, such as a blue quantum dot light-emitting layer 7, a red quantum dot light-emitting layer 8 or a green quantum dot light-emitting layer 9.

Furthermore, in the light-emitting unit, at least one quantum dot light-emitting layer is a composite quantum dot light-emitting layer. For example, the composite quantum dot light-emitting layer is a white quantum dot light-emitting layer 10. For example, the composite quantum dot light-emitting layer is formed by mixing the red quantum dot light-emitting layer, the green quantum dot light-emitting layer and the blue quantum dot light-emitting layer. For example, the composite quantum dot light-emitting layer is provided between monochromic quantum dot light-emitting layers of different colors.

For example, the step of forming the electro-luminescence structure comprises:

Forming an anode on a substrate;
Forming a hole transport layer on the anode;
Forming the quantum dot light-emitting layer on the hole transport layer;
Forming a cathode on the quantum dot light-emitting layer.

For example, the step of forming the hole transport layer on the anode is:

Dispersing poly (3,4-ethylenedioxy thiophene)-poly (styrene sulfonic acid) in isopropyl alcohol, and forming the hole transport layer on the anode for example by a transferring method. For example, the volume ratio of the isopropyl alcohol and the poly (3,4-ethylenedioxy thiophene)-poly (styrene sulfonic acid) is 1:1-3:1, preferably 2:1.

The quantum dot is a zero-dimensional semiconductor light-emitting material, and has obvious quantum local effect, quantum surface effect and quantum dimension effect because of its small dimension, so that the half-peak width of light emitting from the quantum spot material is extremely narrow, and the monochromaticity is good. The size of grain diameter of the quantum dot changes its light-emitting peak value; thus the quantum dot of the embodiments of the disclosure is capable of being "customized". By using the electroluminescence of different quantum dots, three primary colors of red, green and blue with good monochromaticity are obtained. Meanwhile, three quantum dots of R, G and B are mixed in a certain ratio to obtain stable white; such three primary colors of R, G and B and white light form four sub-pixels of R, G, B and W in the display panel, which can increase brightness, reduce power consumption, and make the display panel thinner while replacing the color filter film.

The electro-luminescence efficiency of the quantum dot is determined by carrier mobility, and the carrier mobility is influenced by organic molecule chain (ligand) covering the quantum dot. Too long ligand will cause long carrier migration path, and carrier is easy to be trapped during the migration process, thereby the recombination efficiency is reduced. Too short ligand will make the quantum dot structure unstable and generate agglomeration easily.

In order to improve the carrier mobility, on the one hand, the embodiments of the disclosure mix isopropyl alcohol and (3,4-ethylenedioxy thiophene)-poly (styrene sulfonic acid) (volume ratio is 1:1-3:1, preferably, 2:1) to form the hole transport layer, so as to promote the hole injection efficiency; on the other hand, after the light-emitting layer is formed, the light-emitting layer is post-treated (cleaned) by using 3-mercaptopropionic acid. For example, the solution of 3-mercaptopropionic acid (MPA) in acetonitrile is employed to clean the quantum dot light-emitting layer. During the cleaning process, the solution of 3-mercaptopropionic acid in acetonitrile is coated by a spin coating method. By cleaning the light-emitting layer, the long chain ligand covering the quantum dot light-emitting layer is replaced with a short chain ligand, the carrier migration path is reduced and the carrier mobility is increased. Moreover, by cleaning the light-emitting layer, the quantum dot light-emitting layer becomes more compact, the recombination efficiency of the carrier is increased, and the brightness of the display panel is improved.

For example, in the solution of 3-mercaptopropionic acid in acetonitrile, the volume ratio of 3-mercaptopropionic acid and acetonitrile is 1:8-1:12, preferably, 1:10.

For example, the light-emitting layer after post-treatment is cleaned by acetonitrile, so as to remove remaining MPA and long chain, so that the quantum dot light-emitting layer becomes more compact, and the quantum dot light-emitting layer is formed.

Figure 8:
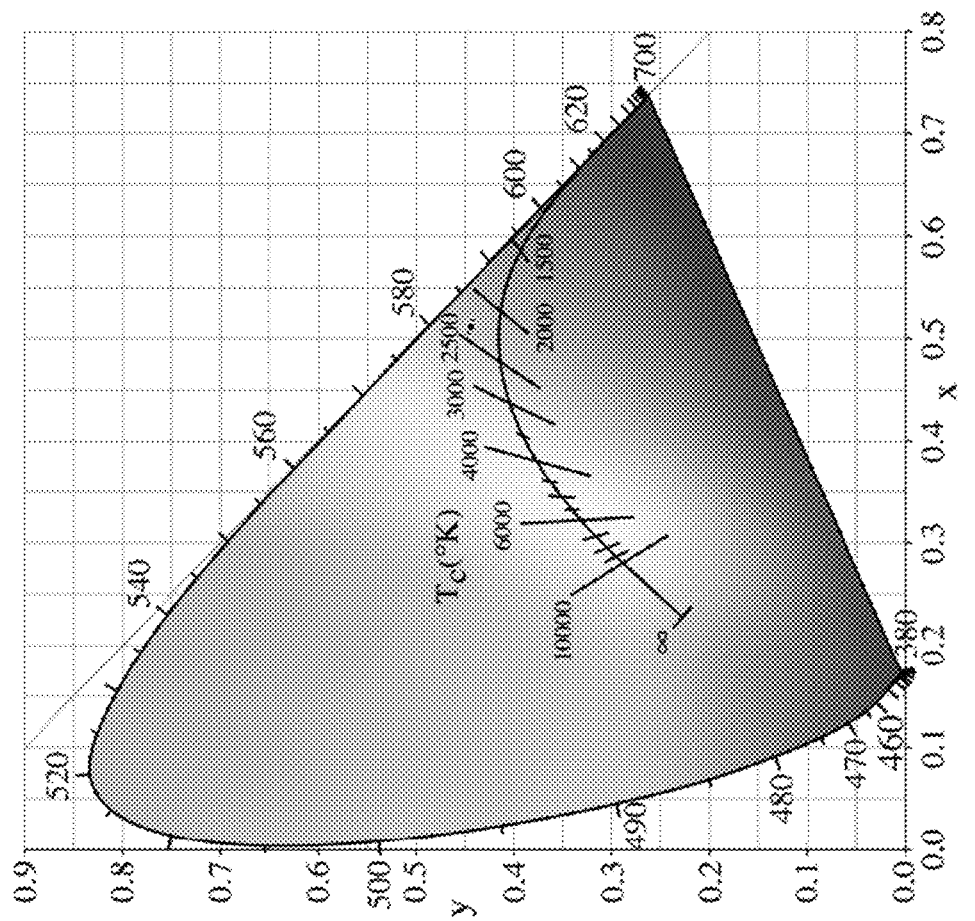
Figure 9:
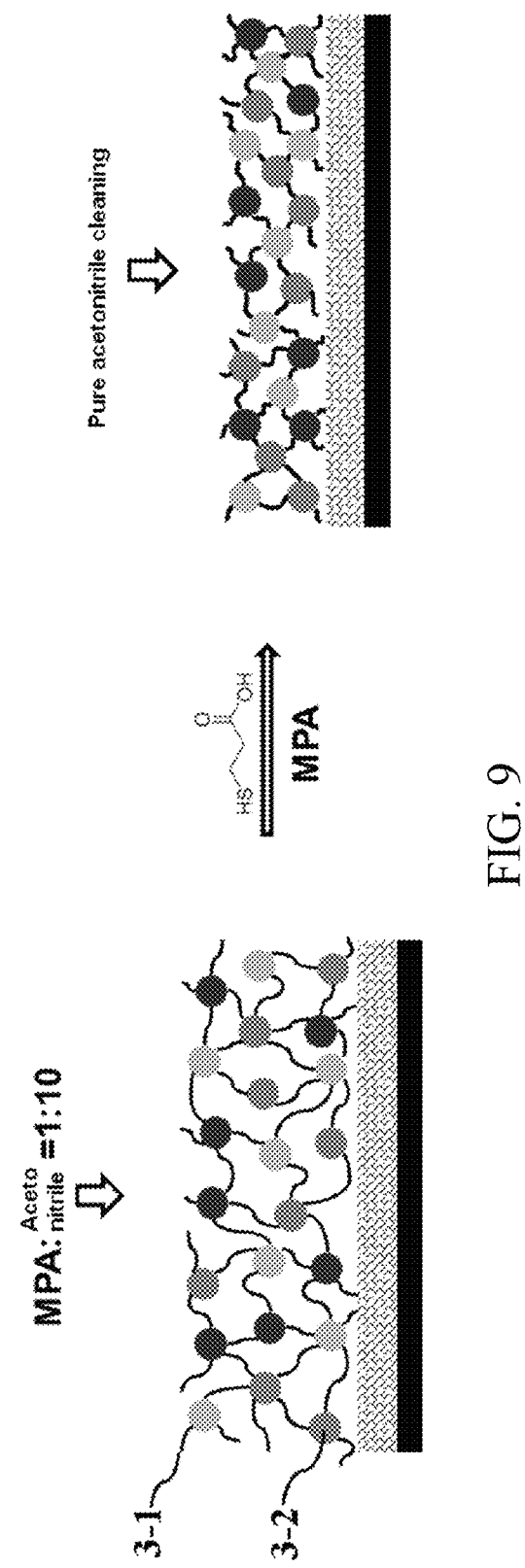
FIG. 9 shows a post-treatment on the light-emitting layer.

As shown in FIG. 8, after cleaned by the solution of 3-mercaptopropionic acid in acetonitrile, the long chain ligand 3-1 covering the quantum dot 3-2 is replaced with the short chain ligand.

For example, the forming the electro-luminescence structure further comprises: forming a hole barrier layer between the quantum dot light-emitting layer 3 and the cathode 6. For example, the hole barrier layer is made of a material comprising 1,3,5-tri (1-phenyl-1H-benzimidazole-2-yl) benzene (TPBI). According to the embodiments of the disclosure, a display device is further provided. The display device comprises the electro-luminescence display panel as described above. Those skilled in the art should understand that, due to the improvement of the display panel, the display device comprising the display panel has improved performance, such as high brightness and efficiency.

Test Sample 1

This test sample proves the influence of cleaning the light-emitting layer by 3-mercaptopropionic acid on the display panel, and verifies whether the luminous efficiency is increased by comparing the spectra before and after the light-emitting layer is cleaned by 3-mercaptopropionic acid. The test method is: carrying out contrast tests between groups A and B, wherein the light-emitting layer of the group A is not treated, and the light-emitting layer of the group B is post-treated by using 3-mercaptopropionic acid, the two groups have completely the same structure; then the spectra of the two groups are compared. The test result is shown in FIG. 4.

Figure 4:
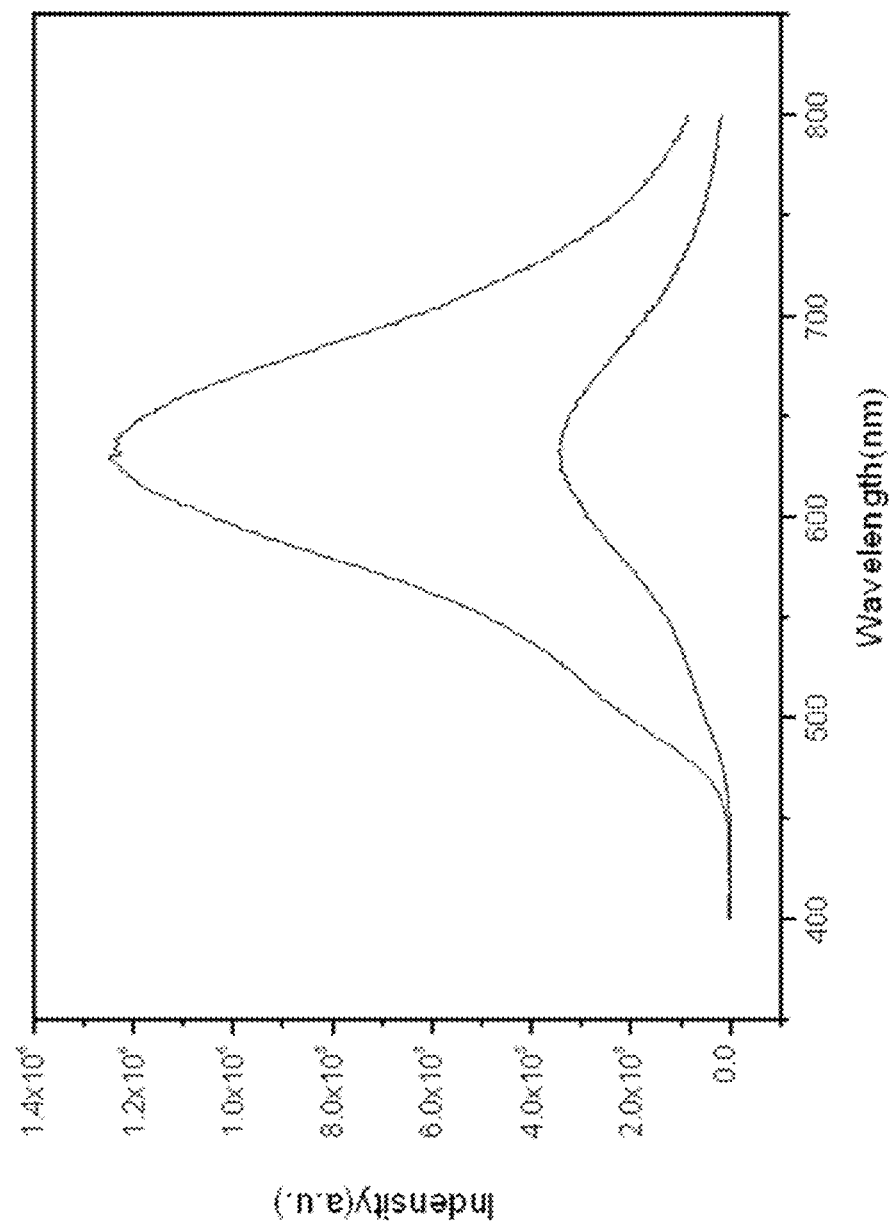
FIG. 4 shows spectra before and after the light-emitting layer is cleaned by a solution of 3-mercaptopropionic acid in acetonitrile.

FIG. 4 shows spectra before and after the light-emitting layer is cleaned by 3-mercaptopropionic acid. It can be seen that the light intensity is increased after cleaning the light-emitting layer by 3-mercaptopropionic acid, indicating that the carrier recombination efficiency is largely improved.

Test Sample 2

The test sample proves the influence of the hole barrier layer on the light-emitting region of the display panel, and verifies whether the hole barrier layer effectively restricts the light-emitting region by comparing color coordinates under different voltages. The test method is: carrying out the contrast tests between groups A and B, wherein the group A does not adopt the hole barrier layer, and the group B adopts the hole barrier layer as described above. The display panels of the two groups are tested under different voltages to determine whether the color coordinates shift under different voltages. If the color coordinates of the group A seriously shift while the color coordinates of the group B is kept at a stable position, it can prove that the hole barrier layer is capable of effectively restricting the light-emitting region. Test results are shown in FIG. 5-FIG. 8.

Figure 5:
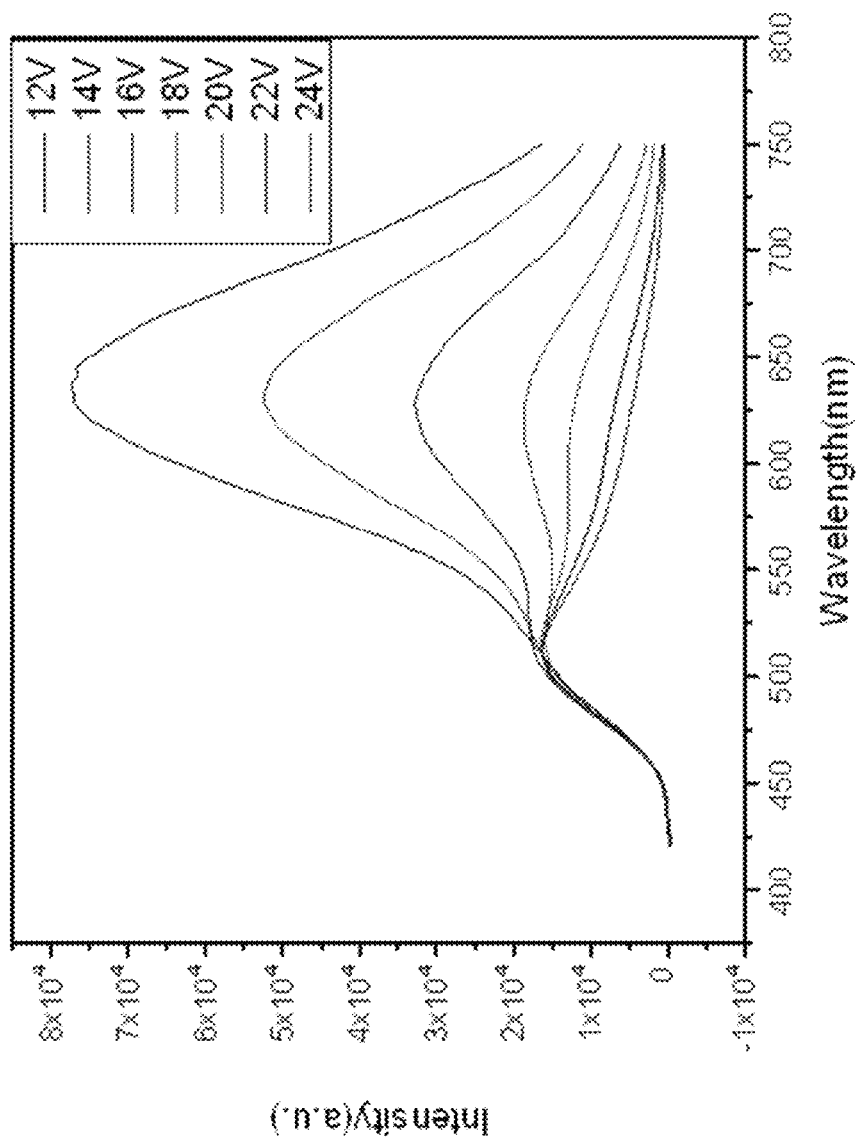
FIG. 5 and FIG. 6 show spectra and corresponding color coordinates under different voltages of the display panel without using the hole barrier layer.
Figure 6:
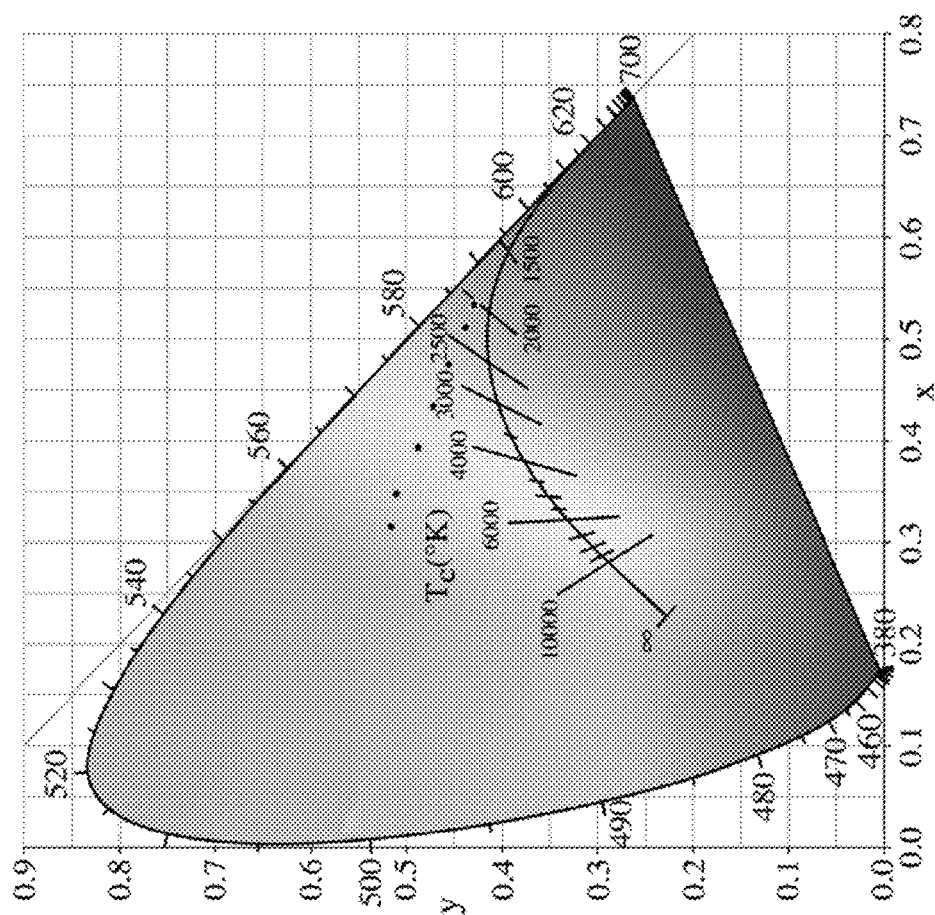

FIG. 5 and FIG. 6 show spectra and corresponding color coordinates under different voltages of the display panel without using the hole barrier layer. It can be seen that the color coordinates are obviously shifted along with the increased voltages, namely, the light-emitting region is obviously shifted.

Figure 7:
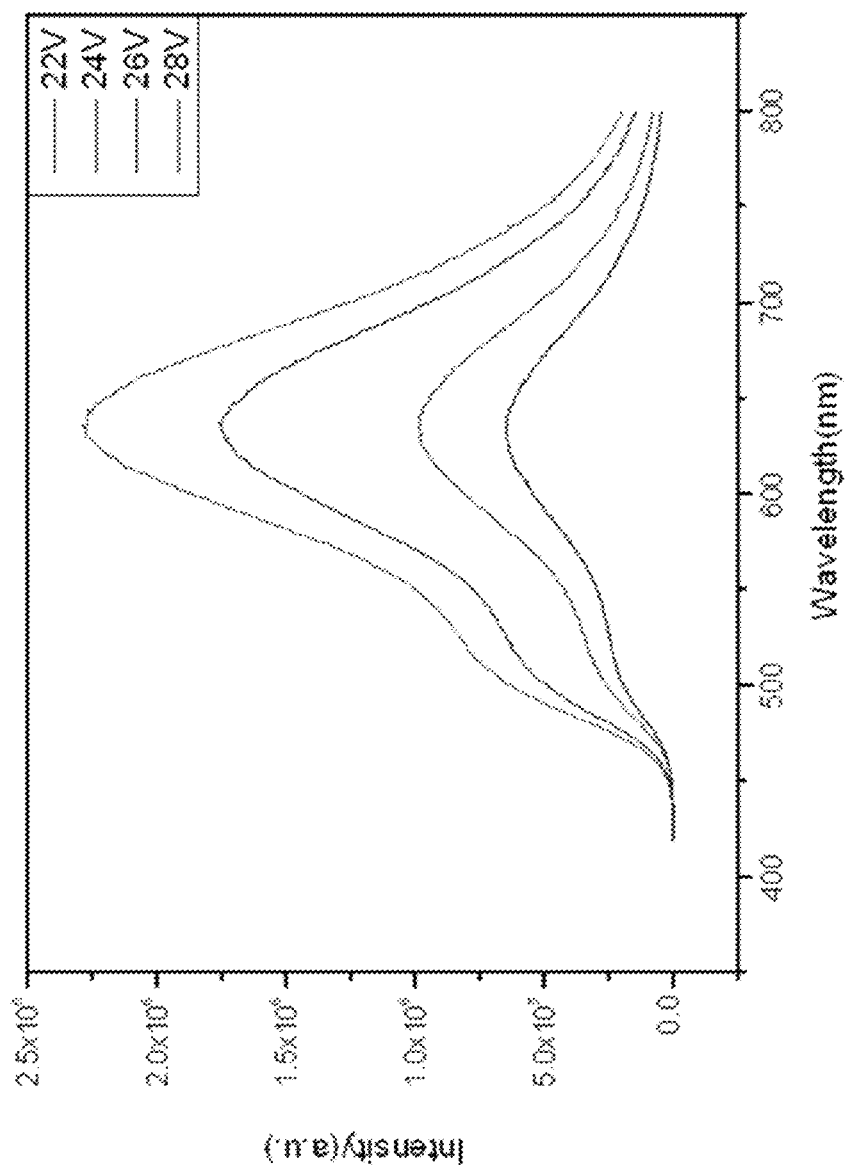
FIG. 7 and FIG. 8 show spectra and corresponding color coordinates under different voltages of the display panel using the hole barrier layer.

FIG. 7 and FIG. 8 show spectra and corresponding color coordinates under different voltages of the display panel using the hole barrier layer. It can be seen that the light intensity is gradually increased along with the increased voltages, but the color coordinates hardly shift, which indicates that the light-emitting region is effectively restricted by the hole barrier layer.

The foregoing embodiments merely are exemplary embodiments of the disclosure, and not intended to define the scope of the disclosure, and the scope of the disclosure is determined by the appended claims.

What is claimed is:

1. An electro-luminescence display panel, comprising a plurality of light-emitting units, wherein each light-emitting unit includes a plurality of sub light-emitting units for displaying different colors, an electro-luminescence structure is provided in each of the sub light-emitting units, the electro-luminescence structure including a quantum dot light-emitting layer, and at least one quantum dot light-emitting layer is a composite quantum dot light-emitting layer, the composite quantum dot light-emitting layer being provided between the monochromic quantum dot light-emitting layers.

2. The display panel according to claim 1, wherein in the light-emitting unit, the quantum dot light-emitting layer is a monochromic quantum dot light-emitting layer.

3. The display panel according to claim 2, wherein the monochromic quantum dot light-emitting layer is a red quantum dot light-emitting layer, a green quantum dot light-emitting layer or a blue quantum dot light-emitting layer.

4. The display panel according to claim 1, wherein the composite quantum dot light-emitting layer is a white quantum dot light-emitting layer.

5. The display panel according to claim 1, wherein the composite quantum dot light-emitting layer is formed by mixing a red quantum dot light-emitting layer, a green quantum dot light-emitting layer and a blue quantum dot light-emitting layer.

6. The display panel according to claim 1, wherein the electro-luminescence structure sequentially comprises an anode, a hole transport layer, the quantum dot light-emitting layer and a cathode, the hole transport layer being made of a material comprising poly (3,4-ethylenedioxy thiophene)-poly (styrene sulfonic acid).

7. An electro-luminescence display panel, comprising a plurality of light-emitting units, wherein each light-emitting unit includes a plurality of sub light-emitting units for displaying different colors, an electro-luminescence structure is provided in each of the sub light-emitting units, and the electro-luminescence structure includes a quantum dot light-emitting layer and a hole barrier layer provided between the quantum dot light-emitting layer and the cathode, the hole barrier layer being made of a material comprising 1,3,5-tri (1-phenyl-1H-benzimidazole-2-yl) benzene.

8. A fabrication method of an electro-luminescence display panel, comprising:
    forming a plurality of light-emitting units,
    wherein each light-emitting unit includes a plurality of sub light-emitting units for displaying different colors;
    forming an electro-luminescence structure in each of the sub light-emitting units, the electro-luminescence structure including a quantum dot light-emitting layer, and at least one quantum dot light-emitting layer being a composite quantum dot light-emitting layer, the composite quantum dot light-emitting layer being provided between the monochromic quantum dot light-emitting layers.

9. The fabrication method according to claim 8, wherein in the light-emitting unit, the quantum dot light-emitting layer is a monochromic quantum dot light-emitting layer.

10. The fabrication method according to claim 8, wherein the forming the electro-luminescence structure comprises:
    forming an anode on a substrate;
    forming a hole transport layer on the anode;
    forming the quantum dot light-emitting layer on the hole transport layer; and
    forming a cathode on the quantum dot light-emitting layer.

11. The fabrication method according to claim 10, wherein the forming the hole transport layer on the anode is: dispersing poly (3,4-ethylenedioxy thiophene)-poly (styrene sulfonic acid) in isopropyl alcohol, and forming the hole transport layer on the anode, and
    the volume ratio of the isopropyl alcohol and the poly (3,4-ethylenedioxy thiophene)-poly (styrene sulfonic acid) is 1:1-3:1.

12. The fabrication method according to claim 10, wherein the forming the quantum dot light-emitting layer on the hole transport layer comprises:
    forming the quantum dot light-emitting layer on the hole transport layer;
    dissolving 3-mercaptopropionic acid into the acetonitrile solution to clean the quantum dot light-emitting layer, wherein the volume ratio of 3-mercaptopropionic acid and acetonitrile is 1:8-1:12; and
    cleaning the quantum dot light-emitting layer by pure acetonitrile.

13. The fabrication method according to claim 10, wherein the forming the electro-luminescence structure further comprises: forming a hole barrier layer between the quantum dot light-emitting layer and the cathode, and the hole barrier layer is made of a material comprising 1,3,5-tri (1-phenyl-1H-benzimidazole-2-yl) benzene (TPBI).

14. A display device, comprising the display panel according to claim 1.

15. The display panel according to claim 7, wherein the electro-luminescence structure sequentially comprises an anode, a hole transport layer, the quantum dot light-emitting layer and a cathode, the hole transport layer being made of a material comprising poly (3,4-ethylenedioxy thiophene)-poly (styrene sulfonic acid).

* * * * *